(12) United States Patent
Demirkan

(10) Patent No.: US 8,222,932 B2
(45) Date of Patent: Jul. 17, 2012

(54) PHASE-LOCKED LOOP WITH SWITCHED PHASE DETECTORS

(75) Inventor: Murat Demirkan, Burlingame, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 172 days.

(21) Appl. No.: 12/710,595

(22) Filed: Feb. 23, 2010

(65) Prior Publication Data

US 2011/0204937 A1 Aug. 25, 2011

(51) Int. Cl.
*H03L 7/06* (2006.01)

(52) U.S. Cl. ........ 327/147; 327/144; 327/152; 327/156; 375/375; 375/376

(58) Field of Classification Search .......... 327/141, 327/144–163; 331/1/A, 15–17; 375/373–376
See application file for complete search history.

(56) References Cited

U.S. PATENT DOCUMENTS

| | | | | |
|---|---|---|---|---|
| 4,538,120 | A * | 8/1985 | Hawkes | 331/12 |
| 4,542,351 | A * | 9/1985 | Okada | 331/11 |
| 5,537,448 | A * | 7/1996 | Schwarz et al. | 375/376 |
| 5,610,954 | A * | 3/1997 | Miyashita et al. | 375/375 |
| 5,982,239 | A * | 11/1999 | Takahashi et al. | 331/11 |
| 6,147,530 | A * | 11/2000 | Nogawa | 327/156 |
| 6,538,518 | B1 * | 3/2003 | Chengson | 331/17 |
| 6,553,089 | B2 * | 4/2003 | Huh et al. | 375/376 |
| 6,741,109 | B1 * | 5/2004 | Huang et al. | 327/156 |
| 7,622,966 | B2 * | 11/2009 | Werker | 327/156 |
| 7,636,018 | B2 * | 12/2009 | Chang et al. | 331/12 |
| 7,965,115 | B2 * | 6/2011 | Jin | 327/147 |
| 2001/0008551 | A1* | 7/2001 | Yamawaki et al. | 375/376 |
| 2006/0104399 | A1* | 5/2006 | Byun et al. | 375/376 |
| 2007/0035347 | A1* | 2/2007 | Sasaki | 331/16 |
| 2008/0224789 | A1* | 9/2008 | Chang et al. | 332/127 |
| 2010/0259307 | A1* | 10/2010 | Kondou | 327/157 |
| 2010/0321120 | A1* | 12/2010 | Kim et al. | 331/25 |

* cited by examiner

*Primary Examiner* — Lincoln Donovan
*Assistant Examiner* — Brandon S Cole

(57) ABSTRACT

A phase-locked loop includes: a voltage-controlled oscillator (VCO) system receiving one or more control signals and in response thereto generating a PLL output signal; a plurality of phase detectors for comparing a reference signal having a reference frequency to a PLL feedback signal having a PLL feedback frequency derived from the PLL output signal, and in response thereto to output a comparison signal; and a plurality of signal processing paths each connected to an output of a corresponding one of the phase detectors for outputting a phase detection output signal. The signal processing paths have different frequency responses from each other. In operation only one of the phase detectors is activated, and a switching arrangement selectively switches between outputs of the signal processing paths to select the phase detection output signal from the activated phase detector to generate the control signal(s) for the VCO system.

23 Claims, 11 Drawing Sheets

PHASE-LOCKED LOOP WITH SWITCHED PHASE DETECTORS

BACKGROUND

Stable, tunable, frequency sources or clocks are required for a number of different systems and applications. One well-known arrangement for such a frequency source is a phase-locked loop (PLL) with locks a voltage-controlled oscillator (VCO) to a stable reference frequency provided by a reference source such a crystal oscillator (XO), or a temperature compensated crystal oscillator (TCXO), etc.

FIG. 1 illustrates on example configuration of a basic PLL 100. PLL 100 includes a VCO 110, PLL feedback divider(s) 120, a phase detector or comparator 130, and a loop filter 140.

In operation, VCO 110 outputs a VCO output signal 115 having a frequency FVCO, a portion of which is provided to PLL feedback divider(s) 120—for example by means of a directional coupler or a power splitter (not shown in FIG. 1). PLL feedback divider(s) 120 divides the frequency of VCO output signal 115 by a PLL feedback divider ratio N, which may be a fixed, or a programmable value, and provides a feedback signal 125 at frequency FVCO/N to phase detector 130. A reference signal 135 is also provided to phase detector 130. Reference signal 135 may be obtained, for example, by dividing the frequency FCLK of an output signal 155 of a reference oscillator 150 (e.g., an XO or TCXO) by a fixed or programmable reference divider value M using reference divider 160. In that case, reference signal 135 has a reference frequency FREF=FCLK/M. Phase detector 130 compares feedback signal 125 to reference signal 135 and outputs a phase detection output signal 145 representing a phase difference between feedback signal 125 and reference signal 135. Loop filter 140 filters phase detection output signal 145 to produce a control signal or tuning voltage 155 which is applied to VCO 110 (e.g., to one or more varactors of VCO 110) to tune the frequency of VCO output signal 115. The operation of a basic PLL such as PLL 100 is well known and will not be repeated here in further detail.

Depending upon the particular application, there are various performance criteria for PLLs such as PLL 100 that can be important. One criterion which is typically important is jitter in the VCO output signal 115. Such jitter can be considered to include random jitter and deterministic jitter. In the frequency domain, random jitter manifests itself as phase noise on the sidebands or skirts on the spectrum of VCO output signal, and deterministic jitter manifests itself as spurious tones (often referred to as "frequency spurs") on the sidebands or skirts on the spectrum of VCO output signal.

FIG. 2 illustrates an example of a frequency spectrum plot 200 of a VCO output signal from a PLL. Plot 200 illustrates a sharp peak 210 at the output frequency FVCO of the PLL. Phase noise 220 corresponds to random jitter in the VCO output signal, and frequency spurs 230 correspond to deterministic jitter.

In general, a primary source of deterministic jitter comprises spurious tones offset from the VCO central frequency, FVCO, at multiples or harmonics of the reference frequency FREF. These frequency spurs are often referred to as "reference spurs."

Accordingly, to improve the overall jitter performance of a PLL, it is desired to reduce the levels of the reference spurs that appear on the VCO output signal's frequency spectrum sidebands.

FIG. 3 illustrates another example of a PLL 300. PLL 300 is similar to PLL 100, with the following significant differences. PLL 300 uses a digital phase/frequency detector (PFD) 330 and a charge pump 350 to provide the control signal for tuning and locking VCO 110 to the reference signal 135. The operation of PLLs with digital PFDs and charge pumps is well known and will not be repeated here. It is known that the PLL architectures that use a combination of digital PFD 330 and charge pump 350 can achieve very low reference spur levels when the up and down pulses of the charge pump are well matched to each other.

Meanwhile, it is well known that random jitter of a PLL output signal within the loop bandwidth of the PLL is dominated by a the jitter from the reference signal, multiplied by the PLL feedback divider ratio, N. Accordingly, to keep this random jitter low, it is necessary to keep the PLL feedback divider ratio N low (e.g., N=2, 4, 5, etc.). If it is required to operate the PLL at very high output frequencies (e.g., 20 GHz), and if N is kept small, then the phase detector must also operate at a high reference frequency, FREF. However, in general digital PFD circuits are limited in their frequencies of operation and, for example, cannot operate at frequencies of several GHz. So, for high output frequencies (e.g., several GHz), it is not possible to operate PLL 300 with low values for the PLL feedback divider ratio N (e.g., N=2, 4, 5, etc.). On the other hand, as explained above, if the PLL feedback divider ratio N is increased, then the level of random jitter in the VCO output signal is also increased.

What is needed, therefore, is a PLL which can operate at high frequencies with desired levels of both random and deterministic jitter.

SUMMARY

In an example embodiment, a phase-locked loop comprises: a voltage-controlled oscillator (VCO) system configured to receive one or more control signals and in response to the one or more control signals to generate a PLL output signal at a PLL output frequency; a plurality of phase detectors each configured to selectively compare a reference signal having a reference frequency to a PLL feedback signal having a PLL feedback frequency derived from the PLL output signal, and in response thereto to output a phase detector output signal, wherein in operation only one of the phase detectors is activated at any time; a plurality of filters each connected to an output of a corresponding one of the phase detectors and configured to output a filtered phase detector output signal; and a switching arrangement configured to select one of the filtered phase detector output signals corresponding to the activated phase detector to generate the one or more control signals for the VCO system.

In another example embodiment, a phase-locked loop (PLL) comprises: a voltage-controlled oscillator (VCO) system configured to receive one or more control signals and in response to one or more control signals to generate a PLL output signal at a PLL output frequency; and a plurality of parallel branches each receiving a reference signal having a reference frequency and a PLL feedback signal having a PLL feedback frequency derived from the PLL output signal. Each of the branches comprises: a phase detector configured to compare the reference signal and the PLL feedback signal, and in response thereto to output a phase detector output signal, means for selectively enabling and disabling the phase detector, a filter connected to an output of the phase detector, the filter being configured to filter the phase detector output signal, and a switch in series with the filter and the phase detector. Outputs of the parallel branches are connected together to provide a selected one of the filtered phase detection output signals for producing the one or more control signals for the VCO system.

In yet another example embodiment, a phase-locked loop (PLL) comprises: a voltage-controlled oscillator (VCO) configured to receive a tuning voltage and in response thereto to generate a VCO output signal at a VCO output frequency (FVCO); a frequency divider configured to divide the VCO output frequency (FVCO) by N and to produce a PLL feedback signal having a frequency of FVCO/N; and a plurality of parallel branches each receiving the PLL feedback signal and a reference signal having a reference frequency. Each of the branches comprises: a phase/frequency detector configured to compare the reference signal and the PLL feedback signal, and in response thereto to output a phase detector output signal, means for selectively enabling and disabling the phase/frequency detector, a filter connected to an output of the phase detector, and a switch in series with the filter and the phase detector. Outputs of the parallel branches are connected together to provide a signal for producing the tuning voltage for the VCO.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims.

Unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

In order to reduce deterministic jitter in a PLL, it may be desired to provide a PLL with a spur-reduction filter to attenuate frequency spurs from a reference signal employed by a phase detector in the PLL. Furthermore, in some embodiments the reference frequency FREF of the reference signal may be varied according to the desired VCO output frequency FVCO, particularly if it desired to be able to be able to adjust the VCO output frequency FVCO over a wide tuning range with fine resolution and low values for the feedback divider ratio N. In that case, as the reference frequency FREF is changed, it may be desirable to be able to adjust or change the frequency response of the spur-reduction filter to "match" the selected value of the reference frequency FREF.

Figure 1:
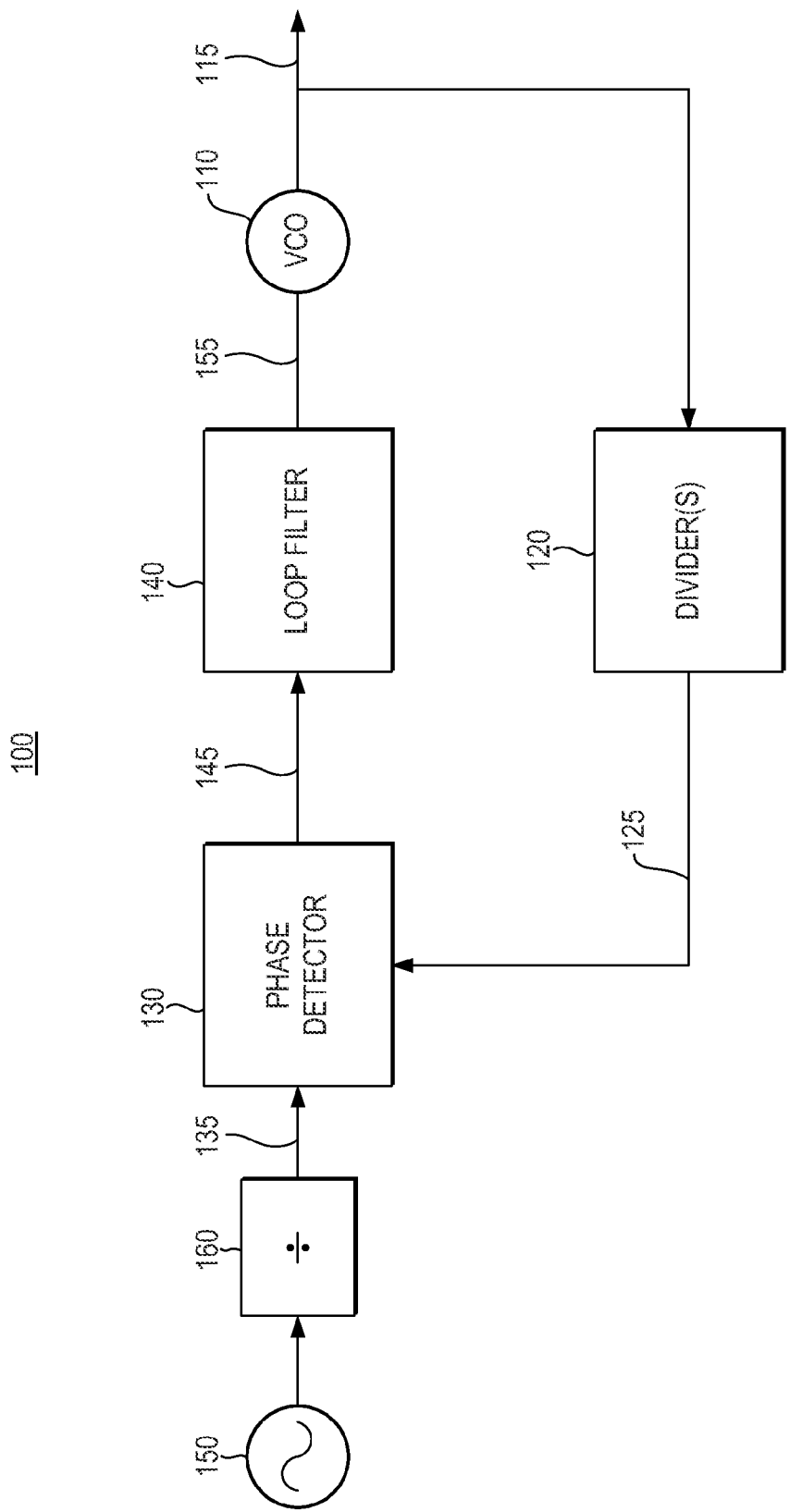
FIG. 1 illustrates on example of a phase-locked loop (PLL).
Figure 2:
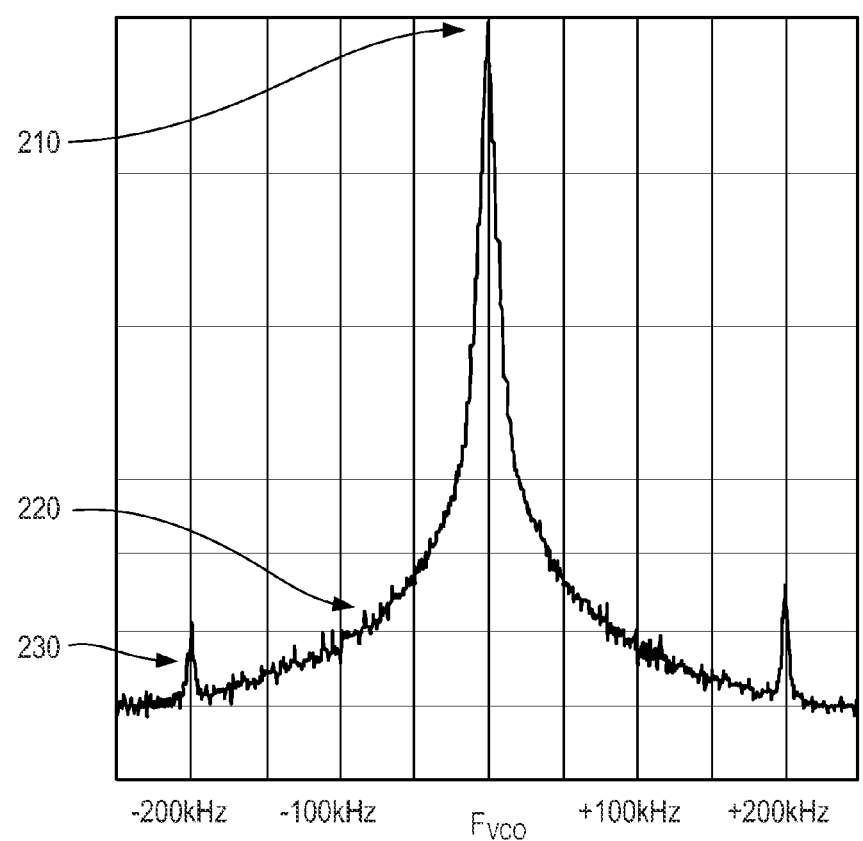
FIG. 2 shows an example plot of the frequency spectrum of a VCO output signal from a PLL.
Figure 3:
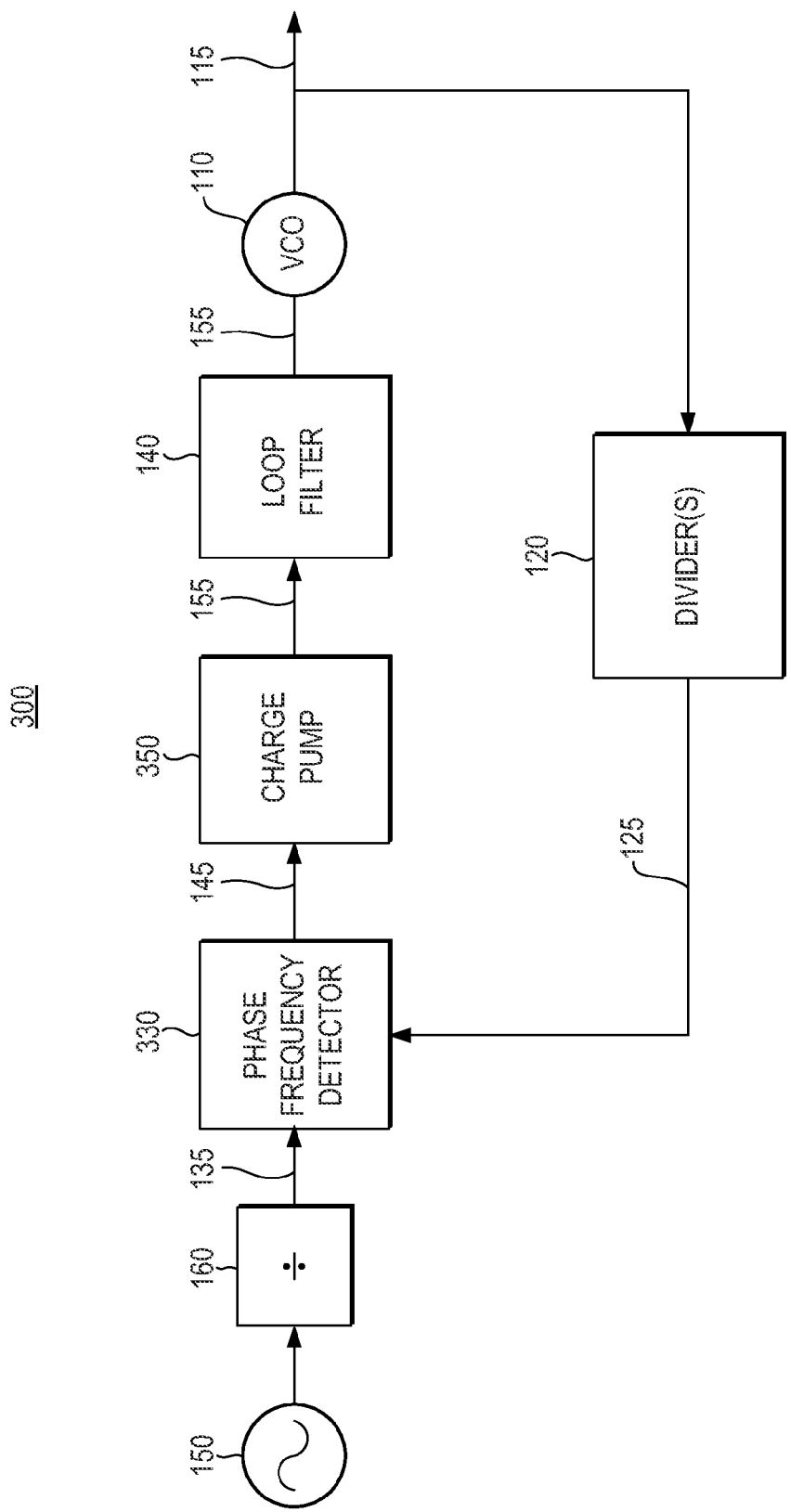
FIG. 3 illustrates another example of a PLL.
Figure 4:
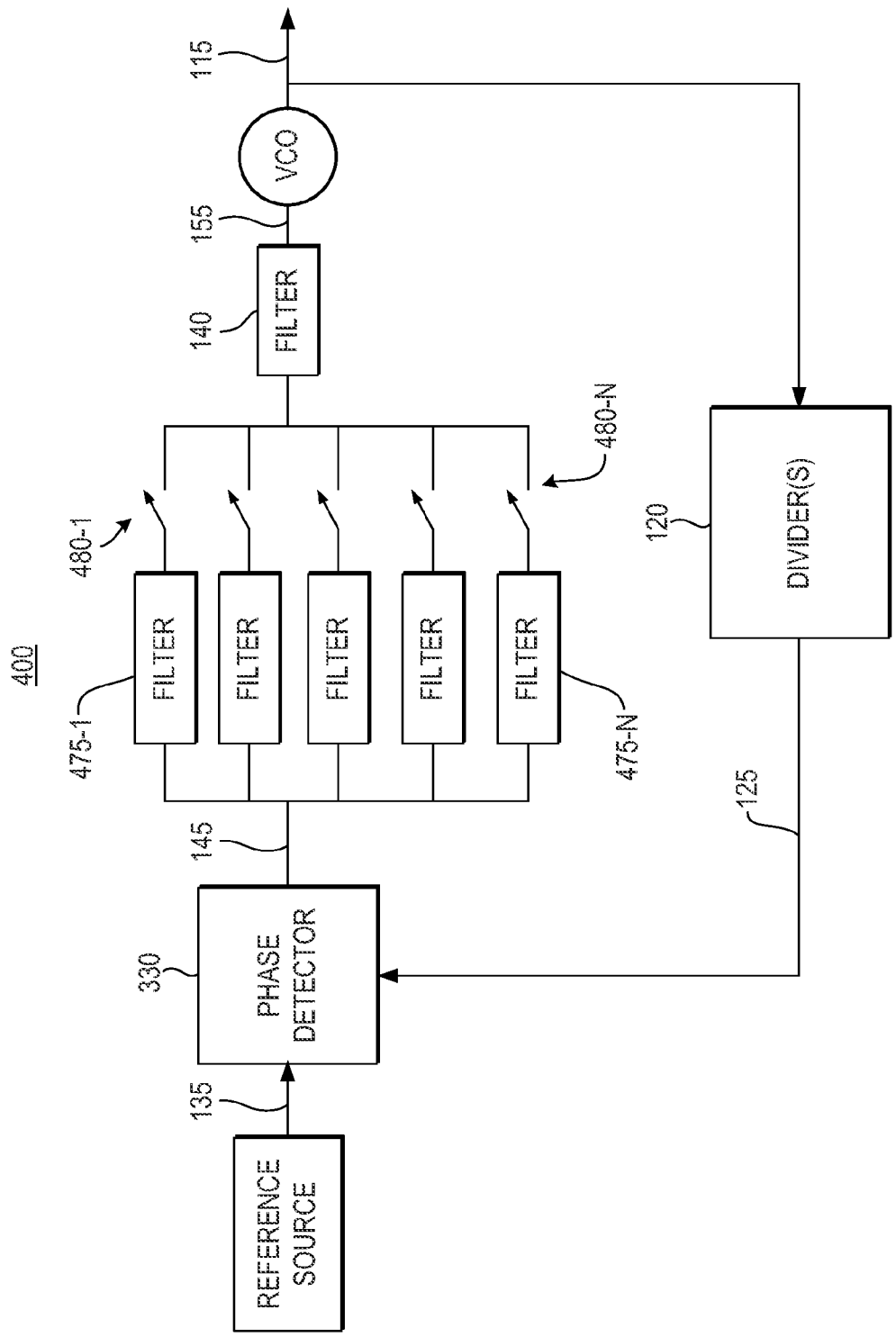
FIG. 4 shows an example of a PLL with spur-reduction filters.

FIG. 4 shows an example of a PLL 400 with a plurality of spur-reduction filters 475-1~475-N, each arranged in parallel and connected with a corresponding switch 480-1~480-N. Each of the spur-reduction filters 475-1~475-N has a different frequency response and a particular filter may be selected via the corresponding switch 480-1~480-N in response to different values of the reference frequency FREF that are employed to produce desired VCO output frequencies FVCO.

However in practice, switches 480-1~480-N have limited isolation (e.g., due to their off capacitances). Accordingly, a portion of the phase detector output signal from phase detector 130 that passes through the unused spur-reduction filters 475-1~475-N that are disabled or switched "off" still gets coupled to the output by leakage through switches 480-1~480-N.

Figure 5:
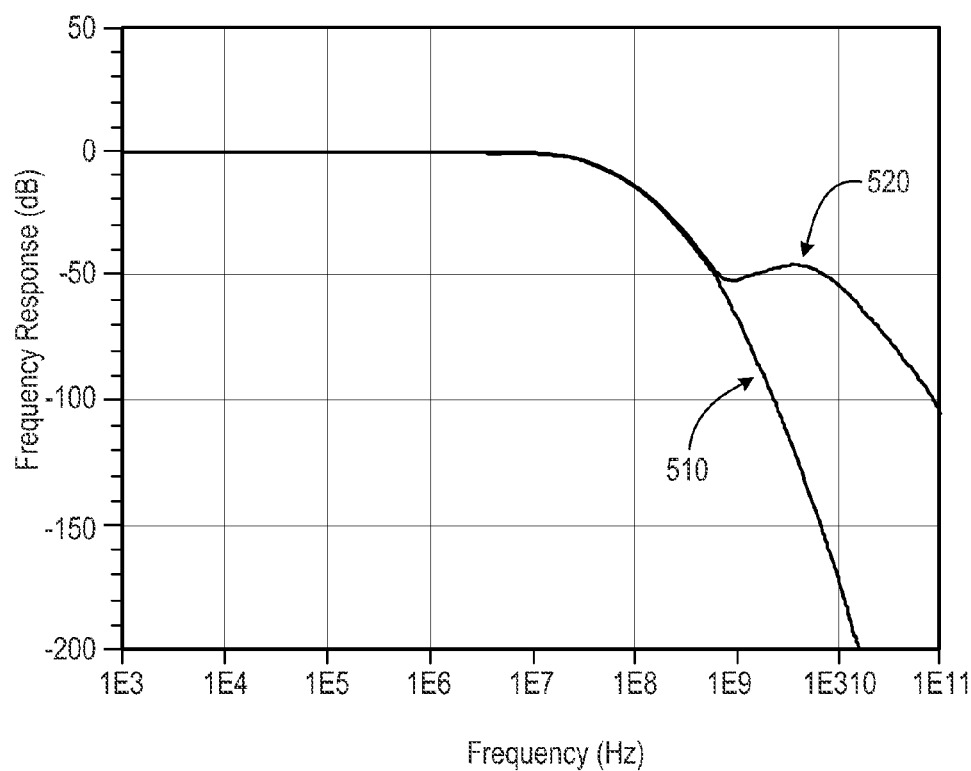
FIG. 5 illustrates a frequency response of an idealized spur-reduction filter, and a filter with a "disabled" wider bandwidth filter in parallel.

FIG. 5 illustrates a frequency response 510 of an idealized spur-reduction filter, and the frequency response 520 of a filter that is in parallel with a "disabled" wider bandwidth filter whose leakage corrupts the overall frequency response. As can be seen from FIG. 5, the limited isolation of switches 480-1~480-N results in substantial leakage of energy through the unselected or "off" filters which in turn substantially and negatively affects the overall frequency response of the parallel arrangement.

Figure 6:
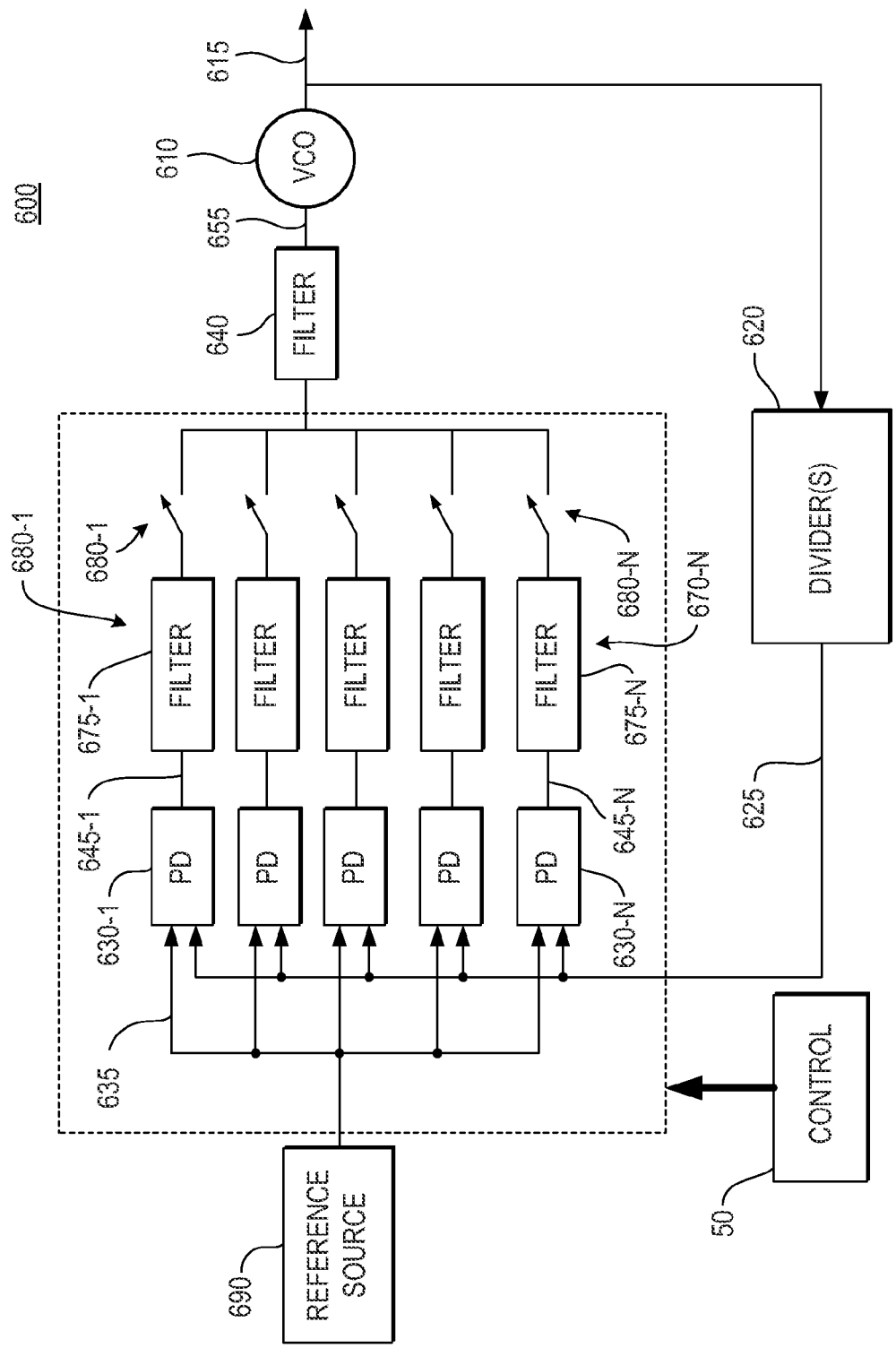
FIG. 6 illustrates one embodiment of a PLL that includes a reference spur suppression arrangement.

Accordingly, FIG. 6 illustrates one embodiment of a PLL 600 that includes a reference spur suppression arrangement. PLL 600 includes a VCO 610, PLL feedback divider(s) 620, phase comparison block 660, and a loop filter 640. Phase comparison block 660 includes a plurality of parallel branches comprising a plurality of phase detectors 630-1~630-N, and a switching arrangement including a plurality of switching devices 680-1~680-N and a plurality of signal processing paths 670-1~670-N between the phase detectors 630-1~630-N, and the plurality of switches 680-1~680-N. That is, each of the parallel branches includes a corresponding phase detector 630-i, and a corresponding of switching device 680-i, and a signal processing path 670-i connected between the phase detector 630-i and the switching device 680-i.

In some embodiments, switching devices 680-1~680-N may comprise transmission gate type switches.

Signal processing paths 670-1~670-N all having different frequency responses or transfer functions from each other, as will be discussed in greater detail below. Beneficially, signal processing paths 670-1~670-N include filters 675-1~675-N (e.g., spur reduction filters or low pass filters). In some embodiments, signal processing paths 670-1~670-N may each include one or more amplifiers or buffers. In some embodiments, one of the signal processing paths 670-1~670-N may not include a filter 675-*i* or any specific filtering components or elements, although of course as a practical matter it will still have a bandlimited frequency response at very high frequencies.

In some embodiments, loop filter 640 may be omitted and its filtering function may be subsumed within the filters 675-1~675-N.

A reference source 690 provides a reference signal 635 to each of the phase detectors 630-1~630-N. Reference signal 635 has a reference frequency FREF, which may be programmable or selectable. Reference signal 635 may be obtained, for example, by dividing the frequency FCLK of an output signal of a reference oscillator (e.g., an XO or TCXO) by a fixed or programmable value M.

Beneficially, in PLL 600 the reference frequency FREF is programmable and may be varied or selected according on a desired output frequency of PLL 600. Accordingly, each of the parallel branches in phase comparison block 660 has a corresponding signal processing path 670-*i* with a different frequency response matched to a different value or set of values for the reference frequency FREF in order to attenuate the corresponding reference spurs to a desired value while still maintaining a desired phase noise (random jitter) level.

In operation, VCO 610 receives a control signal or tuning voltage 655 and in response thereto outputs a VCO output signal 615 having a frequency FVCO. A portion of the VCO output signal 615 is provided to divider(s) 620—for example by means of a directional coupler or a power splitter (not shown in FIG. 6). Divider(s) 620 divides the frequency of VCO output signal 615 by a PLL feedback divider ratio N, which may be a fixed, or a programmable value, and provides a PLL feedback signal 625 at frequency F/N to each of the phase detectors 630-1~630-N.

A value for the reference frequency FREF and the PLL feedback divider ratio N are selected such that when PLL 600 is in a phase locked condition, VCO 620 will output the VCO output signal 615 at a desired VCO output frequency FVCO. Corresponding to the selected value of the reference frequency FREF, one of the signal processing paths 670-1~670-N is selected that will provide the desired attenuation of the reference spurs for that particular reference frequency FREF. Switching devices 680-1~680-N are turned on and off to determine which of the signal processing paths 670-1~670-N is enabled or active. However, the switching devices 680-1~680-N that are turned off only provide limited isolation (e.g., due to their off capacitances). Accordingly, to provide better isolation, detectors 630-1~630-N connected to the unused signal processing paths 670-1~670-N are disabled. Consequently, there is a no active signal at the outputs of the unused phase detectors 630-1~630-N and hence leakage through the turned-off switching devices 680-1~680-N is reduced.

The phase detector 630-*i* that is connected to the selected signal processing path 670-*i* is activated or enabled so as to compare the reference signal 635 to the PLL feedback signal 625 and in response thereto to output a comparison signal. The other phase detectors 630-1~630-N in phase comparison block 660 are disabled or deactivated. The switching devices 680-1~680-N are controlled so as to turn on the switching device 680-*i* that is connected to the selected phase detector 630-*i* and the selected signal processing path 670-*i*, and to turn off the other switching devices 680-1~680-N. That is, the switching devices 680-1~680-N are controlled so as to selectively switch between outputs of the signal processing paths 670-1~670-N to select the phase detection output signal from the activated phase detector 680-*i* to generate (e.g., by passing through loop filter 640) the control signal or tuning voltage 655 for the VCO 610.

A control block 50 may provide control signals for selectively activating and deactivating the phase detectors 630-1~630-N and for controlling the switching devices 680-1~680-N. In some embodiments, phase detectors 630-1~630-N may be activated or deactivated by connecting or disconnecting one or more supply currents and/or voltages from phase detectors 630-1~630-N, and/or by connecting or disconnecting the outputs of phase detectors 630-1~630-N to one or more supply voltages. In some embodiments, control block 50 may also control the divider value N of PLL feedback divider(s) 620 and/or the value of the reference frequency FREF (e.g., by controlling a reference frequency divider value M).

As a result of their phase detectors 630-1~630-N being disabled or deactivated, signal leakage through the deselected signal processing paths 670-1~670-N in phase comparison block 660 may be substantially reduced. In this way, even though phase detectors 630-1~630-N are multiplier-based phase detectors (which in general generate higher reference spur levels than a digital phase-frequency detector) low reference spur levels may still be achieved. Meanwhile, as discussed above, a multiplier-based phase detector can operate at a higher reference frequency FREF, and so low values may be employed for PLL feedback divider ratio N. Accordingly, VCO output signal 615 may have low random jitter and also have low reference spur levels.

Figure 7:
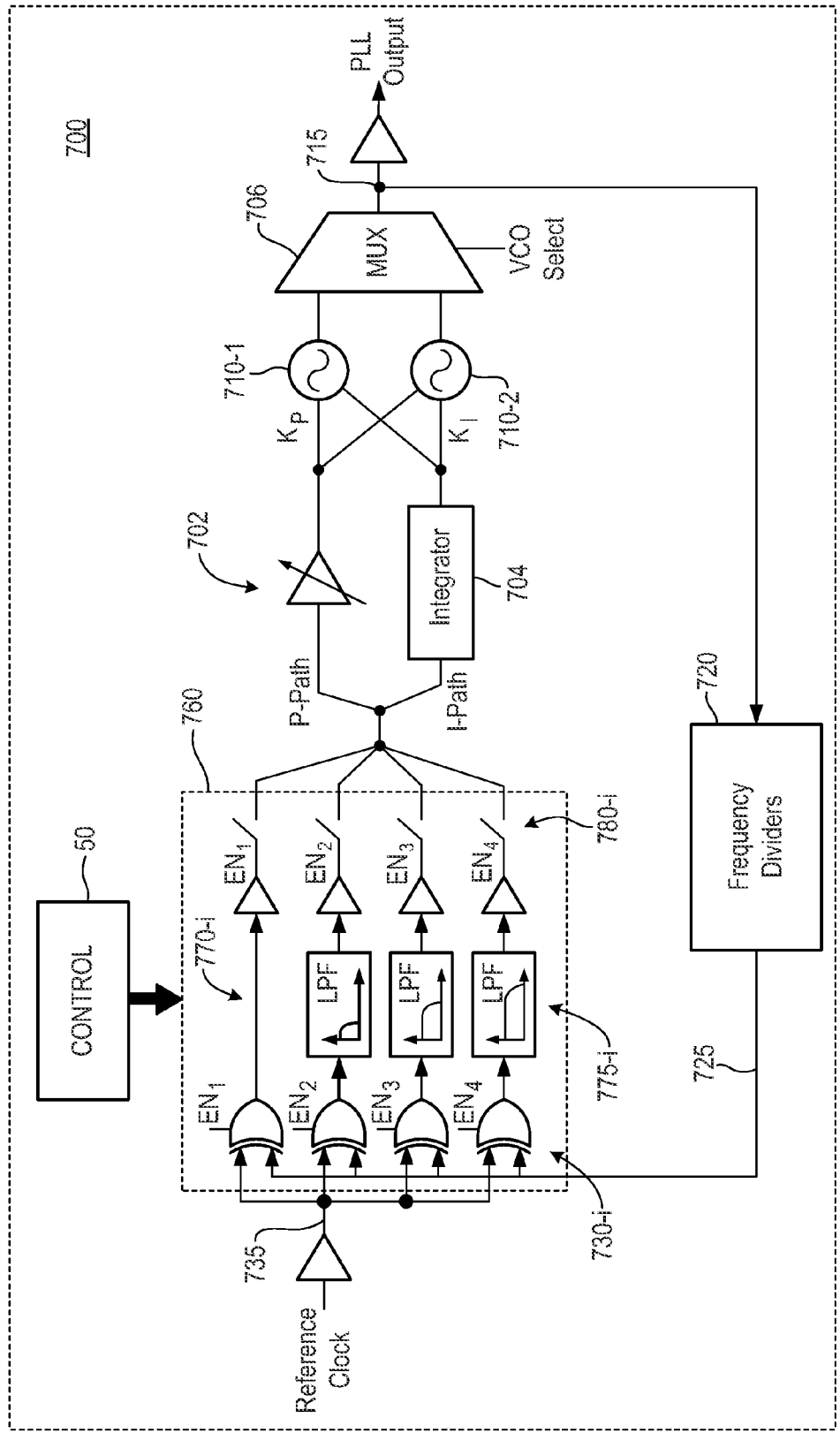
FIG. 7 illustrates another embodiment of a PLL that includes a reference spur suppression arrangement.

FIG. 7 illustrates another embodiment of a PLL 700 that includes a spur suppression arrangement. PLL 700 includes first and second VCOs 710-1 and 720-2, PLL feedback divider(s) 720, a phase comparison block 760, a variable gain amplifier 702, an integrator 704, and a multiplexer 760. Phase comparison block 760 includes a plurality of parallel branches. Each branch includes a corresponding phase detector 730-*i*, a signal processing path 770-*i*, and a switching device 780-*i*.

PLL 700 includes two VCOs 710-1 and 720-2 in order to increase the operating tuning range of PLL 700, for example to cover an entire octave. In PLL 700, each of the VCOs 710-1 and 720-2 includes two varactors and receives a corresponding pair of control signals or tuning voltages from variable gain amplifier 702, an integrator 704. Multiplexer 706 selects from between the VCO output signals to produce a PLL output signal 715.

In some embodiments, PLL 700 may be used in various wireless transmitters, or to test various serial-link transceivers, and in these applications may be required to achieve low jitter for different loop bandwidth configurations. In addition, in some embodiments PLL 700 may be required to work with a broad range of reference frequencies FREF (e.g., up to 20 GHz).

Each signal processing path 770-*i* has a different frequency response or transfer function than the others. Beneficially, each signal processing path 770-*i* includes a filter 775-*i* (e.g., a spur reduction filter). In some embodiments, signal processing paths 770-*i* may include one or more amplifiers or buffers. In some embodiments, one of the signal processing paths 770-*i* may not include a filter or any specific filtering components or elements, although of course as a practical matter it will still have a bandlimited frequency response at very high frequencies.

By means of the different signal processing paths 770-*i* with different spur-reduction filters 775-*i*, PLL 700 may achieve low output spur levels for a wide range of reference frequencies.

In operation, switching devices 780-*i* are turned on and off to determine which of the signal processing paths 770-*i* is enabled or active. However, the switching devices 780-*i* that are turned off only provide limited isolation (e.g., due to their off capacitances). Accordingly, to provide better isolation, the phase detectors 730-*i* connected to the unused signal processing paths 770-*i* are disabled. Consequently, there is a no active signal at the outputs of the unused phase detectors 730-*i* and hence leakage through the turned-off switching devices 780-*i* is reduced.

The phase detector 730-*i* that is connected to the selected signal processing path 770-*i* is activated or enabled to compare the reference signal 735 to the PLL feedback signal 725, and the other phase detectors 730-*i* in phase comparison block 760 are disabled or deactivated. The switch 780-*i* connected to the selected phase detector 730-*i* and the selected signal processing path 770-*i* is controlled to connect the output of selected branch to loop filter 740 to thereby provide the control signal or tuning voltage for VCO 710.

A control block 50 may provide control signals for selectively activating and deactivating the phase detectors 730-*i* and for controlling the switching devices 780-*i*. In some embodiments, phase detectors 730-*i* may be activated or deactivated by connecting or disconnecting one or more supply currents and/or voltages from phase detectors 730-*i*, and/or by connecting or disconnecting the outputs of phase detectors 730-*i* to one or more supply voltages. In some embodiments, control block 50 may also control the value N of PLL feedback divider(s) 720 and/or the value of the reference frequency FREF (e.g., by controlling a reference frequency divider value M).

As a result of their phase detectors 730-*i* being disabled or deactivated, signal leakage through the deselected signal processing paths 770-*i* in phase comparison block 760 may be substantially reduced. In this way, even though phase detectors 730-*i* are multiplier-based phase detectors (which in general generate higher reference spur levels than a digital phase-frequency detector) low reference spur levels may still be achieved. Meanwhile, as discussed above, a multiplier-based phase detector can operate at a higher reference frequency FREF, and so low values may be employed for PLL feedback divider ratio N. Accordingly, VCO output signal 715 may have low random jitter and also have low reference spur levels.

Figure 8:
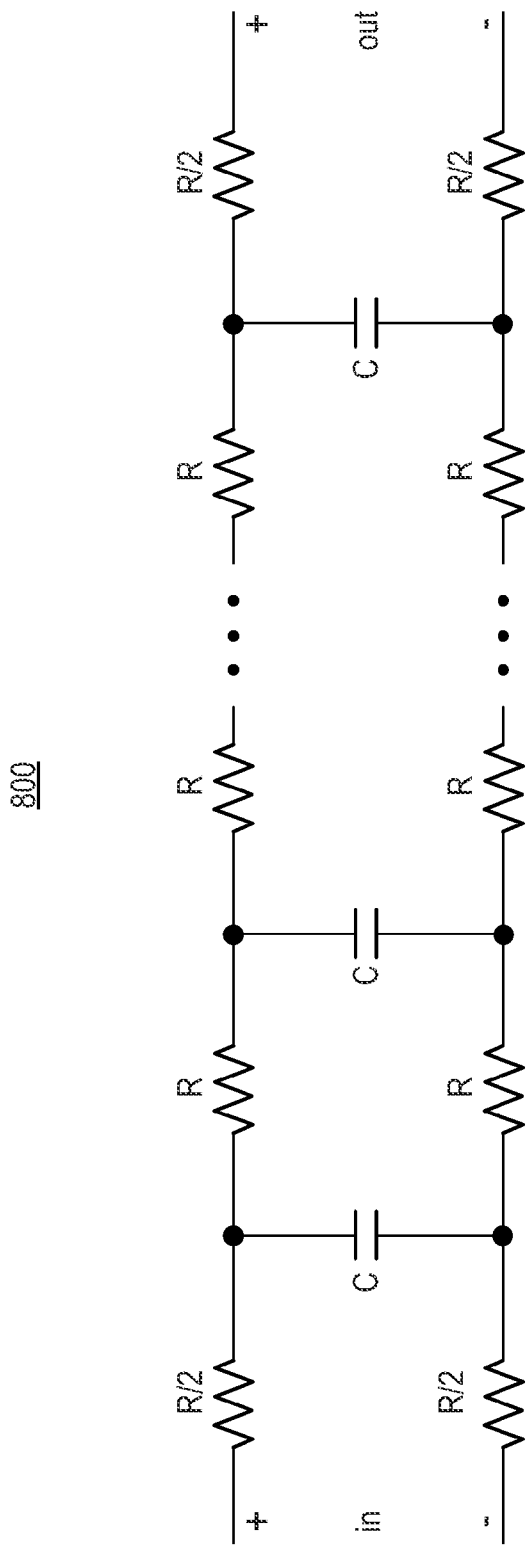
FIG. 8 illustrates one embodiment of a spur-reduction filter that may be used in a PLL.

FIG. 8 illustrates one embodiment of a spur-reduction filter 800 that may be used in a PLL. Spur reduction filter 80 is a generic multi-pole passive low-pass filter. Other filter configurations may be employed according to the specific requirements for a particular PLL.

Beneficially, multiplier-type phase detectors may be employed in a PLL when it is necessary to generate high VCO output frequencies, and also to use low values for the PLL feedback divider ratio N in order to achieve desired random jitter levels.

Figure 9:
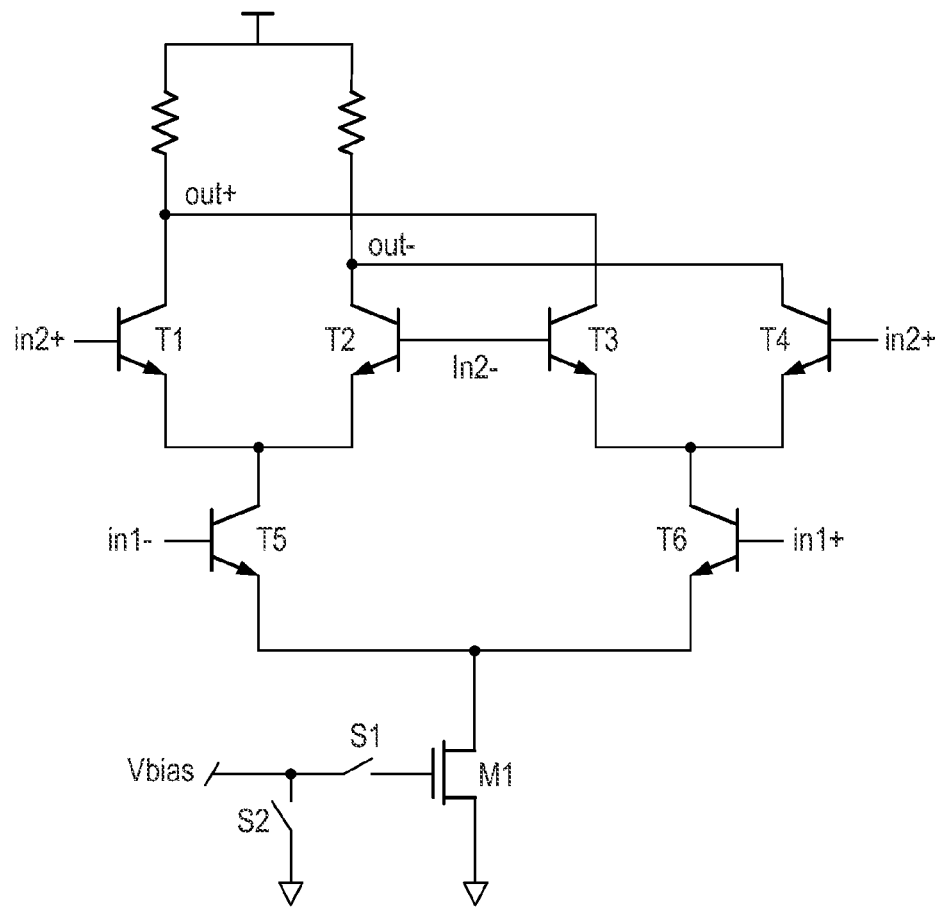
FIG. 9 illustrates one embodiment of a multiplier phase detector that may be used in a PLL.

FIG. 9 illustrates one embodiment of a phase detector 900 that may be used in a PLL, such as PLL 700. Phase detector 900 comprises a Gilbert multiplier phase detector. Phase detector 900 is selectively activated (or enabled) and deactivated (or disabled) by digitally controlling the tail bias current source as shown in FIG. 9. When switch 51 is closed and switch S2 is open, then phase detector 900 is activated (or enabled). When switch S1 is open and switch S2 is closed, then the gate of transistor M1 is connected to ground, and hence no current can flow through transistors T1~T6 and the outputs of phase detector 900 go to the positive supply voltage.

In practice, in phase detector 900 when S1 is open and switch S2 is closed, then the gate of transistor M1 is connected to ground a small leakage current may still flow through M1, causing currents to flow through transistors T1~T6 as well. Therefore, even when the tail current source is disabled, there may still be some activity at the output of phase detector 900.

Figure 10:
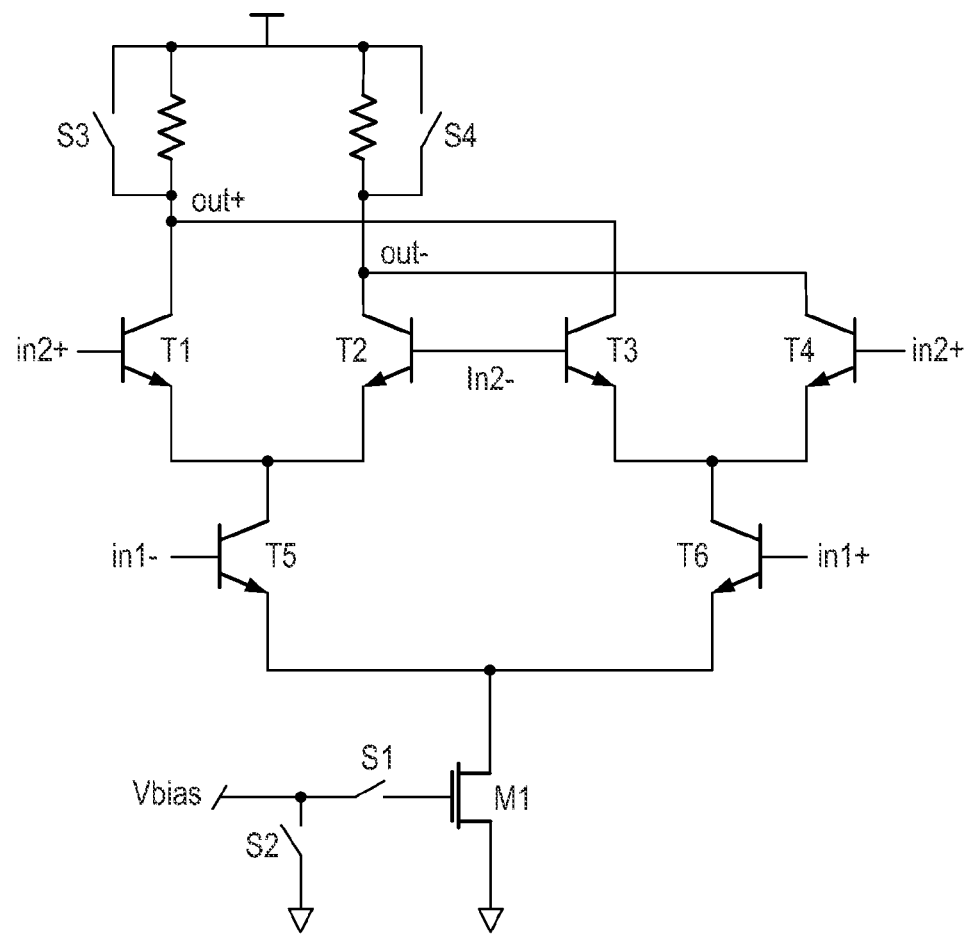
FIG. 10 illustrates another embodiment of a multiplier phase detector that may be used in a PLL.

FIG. 10 illustrates another embodiment of a multiplier phase detector 1000 that may be used in a PLL. In comparison to phase detector 900, phase detector 1000 includes additional switches S3 and S4 to further improve isolation between the inputs and outputs of the unused phase detectors in a PLL such as PLL 700. When the tail current source M1 is disabled, the switches S3 and S4 can be closed, providing a low impedance path between the phase detector outputs and the positive power supply voltage. Switches S3 and S4 must remain open when phase detector 1000 is enabled or activated.

Figure 11:
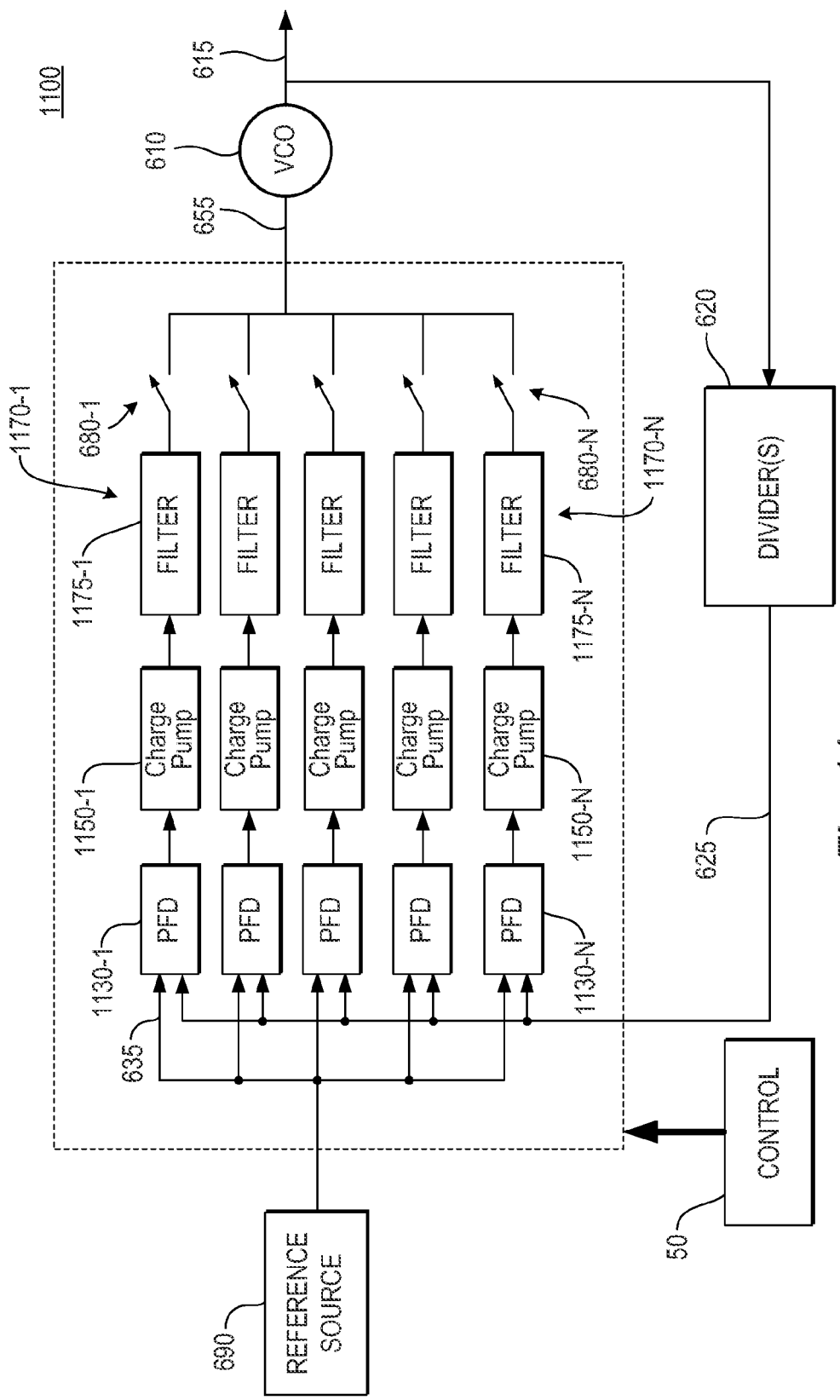
FIG. 11 illustrates yet another embodiment of a PLL that includes a reference spur suppression arrangement.

FIG. 11 illustrates yet another embodiment of a PLL 1100 that includes a spur suppression arrangement.

PLL 1100 is similar to PLL 700, except that it includes in the parallel branches of phase comparison block 760 phase/frequency detectors (PFDs) (e.g., digital PFDs) 1130-1~1130-N, and accompanying charge pumps 1150-1~1150-N in addition to signal processing branches 1170-1~1170-N. That is, each branch includes a 1130-*i*, an accompanying charge pumps 1150-*i*, and a signal processing branch 1170-*i*. Also, in PLL 1100, filters 1175-1~1175-N include the PLL loop filter response, and therefore no separate loop filter is included. Of course in other embodiments, a separate loop filter may be provided in the signal path between phase comparison block 1160 and VCO 610.

It should be noted that the switched filters 675-*i*, 775-*i*, and 1175-*i* can be used for more than just spur reduction, but can also serve to shape the phase noise characteristics of their respective PLLs and in some embodiments the loop filter response can be subsumed within the switched filters 675-*i*, 775-*i*, and 1175-*i*.

While example embodiments are disclosed herein, one of ordinary skill in the art appreciates that many variations that are in accordance with the present teachings are possible and remain within the scope of the appended claims. A variety of different PLL configurations may be provided which include different divider configurations, mixers with offset frequencies, etc., and which employ the disclosed configuration of parallel branches with different filter bandwidths and having dedicated phase detectors which can be selectively activated and deactivated. The invention therefore is not to be restricted except within the scope of the appended claims.

The invention claimed is:

1. A phase-locked loop, comprising:
 a voltage-controlled oscillator (VCO) system configured to receive one or more control signals and in response to the one or more control signals to generate a PLL output signal at a PLL output frequency;
 a plurality of phase detectors each configured to receive at a same time as each other: (1) a same reference signal as each other, and (2) a same PLL feedback signal as each other, the PLL feedback signal having a PLL feedback frequency derived from the PLL output signal, wherein in operation only one of the phase detectors is activated at any time such that when it is activated it compares the reference signal to the PLL feedback signal, and in response thereto outputs a comparison signal;
 a plurality of signal processing paths each connected to an output of a corresponding one of the phase detectors, the signal processing paths having different frequency responses from each other, each signal processing path being configured such that when the corresponding phase detector is activated, the signal processing path receives the comparison signal and in response thereto outputs a phase detection output signal; and a switching arrangement configured to selectively switch between outputs of the signal processing paths to select the phase detection output signal from the activated phase detector to generate the one or more control signals for the VCO system.

2. The PLL of claim 1, further comprising a frequency divider configured to divide the PLL output frequency ($F_{PLL}$) by N and to produce the PLL feedback signal having the PLL feedback frequency of $F_{PLL}/N$.

3. The PLL of claim 1, wherein the phase detectors each comprise a Gilbert multiplier.

4. The PLL of claim 3, wherein each phase detector includes at least one switch for disabling a bias current source for the phase detector.

5. The PLL of claim 4, wherein each phase detector further includes at least one switch for connecting an output of the phase detector to a supply voltage.

6. The PLL of claim 1, wherein the VCO system comprises:
at least two VCOs, each VCO receiving the at least one control signal and in response thereto producing a corresponding VCO output signal; and
a multiplexer configured for selecting one of the VCO output signals as the PLL output signal.

7. The PLL of claim 1, further comprising a control signal generating circuit, comprising:
a variable gain amplifier configured to receive the phase detection output signal and in response thereto to output to the VCO system a first one of the one or more control signals; and
an integrator configured to receive the phase detection output signal and in response thereto to output to the VCO system a second one of the one or more control signals.

8. The PLL of claim 1, wherein the plurality of signal processing paths include a plurality of filters each having a different bandwidth from each other.

9. The PLL of claim 8, further comprising a reference frequency generator configured to provide the reference signal to the phase detectors, wherein the reference frequency of the reference signal is selectable to have a plurality of different values, and wherein the switching arrangement is controlled to select one of the signal processing paths corresponding to the selected reference frequency value.

10. The PLL of claim 1, wherein each phase detector includes means for selectively connecting and disconnecting at least one of a supply voltage and a supply current to the phase detector to selectively activate and deactivate the phase detector.

11. A phase-locked loop (PLL), comprising:
a voltage-controlled oscillator (VCO) system configured to receive one or more control signals and in response to one or more control signals to generate a PLL output signal at a PLL output frequency; and
a plurality of parallel branches each receiving a reference signal having a reference frequency and a PLL feedback signal having a PLL feedback frequency derived from the PLL output signal, each of the parallel branches comprising:
a phase detector configured to receive the reference signal and the PLL feedback signal,
means for selectively enabling and disabling the phase detector, such that when the phase detector is enabled it compares the reference signal to the PLL feedback signal and in response thereto outputs a comparison signal,
a switching device, and
a signal processing path connected in series with the phase detector and the switching device, the signal processing path being configured to apply a frequency transfer function to the comparison signal,
wherein outputs of the parallel branches are connected together to provide a phase detection output signal for producing the one or more control signals for the VCO system.

12. The PLL of claim 11, further comprising a frequency divider configured to divide the PLL output frequency ($F_{PLL}$) by N and to produce the PLL feedback signal having the PLL feedback frequency of $F_{PLL}/N$.

13. The PLL of claim 11, wherein the phase detectors each comprise a Gilbert multiplier.

14. The PLL of claim 11, wherein the means for selectively enabling and disabling the phase detector includes at least one switch for disabling a bias current source for the phase detector.

15. The PLL of claim 14, wherein the means for selectively enabling and disabling the phase detector further includes at least one switch for connecting an output of the phase detection to a supply voltage.

16. The PLL of claim 11, wherein the VCO system comprises:
at least two VCOs, each VCO receiving the at least one control signal and in response thereto producing a corresponding VCO output signal; and
a multiplexer configured for selecting one of the VCO output signals as the PLL output signal.

17. The PLL of claim 11, further comprising a control signal generating circuit, comprising:
a variable gain amplifier configured to receive the phase detection output signal and in response thereto to output to the VCO system a first one of the one or more control signals; and
an integrator configured to receive the phase detection output signal and in response thereto to output to the VCO system a second one of the one or more control signals.

18. The PLL of claim 11, wherein the plurality of signal processing paths include a plurality of filters each having a different bandwidth.

19. The PLL of claim 11, further comprising a reference frequency generator configured to provide the reference signal to the parallel branches, wherein the reference frequency of the reference signal is selectable to have a plurality of different values, and wherein the switching arrangement is controlled to select one of the signal processing paths corresponding to the selected reference frequency value.

20. The PLL of claim 11, wherein the means for selectively enabling and disabling the phase detector comprises means for selectively connecting and disconnecting at least one of a supply voltage and a supply current to the phase detector to selectively activate and deactivate the phase detector.

21. A phase-locked loop (PLL), comprising:
a voltage-controlled oscillator (VCO) configured to receive a tuning voltage and in response thereto to generate a VCO output signal at a VCO output frequency ($F_{VCO}$);
a frequency divider configured to divide the VCO output frequency ($F_{VCO}$) by N and to produce a PLL feedback signal having a frequency of $F_{VCO}/N$; and a plurality of parallel branches each receiving the PLL feedback signal and a reference signal having a reference frequency, each of the branches comprising:
- a phase/frequency detector configured to receive the reference signal and the PLL feedback signal,
- means for selectively enabling and disabling the phase/frequency detector, such that when the phase/frequency detector is enabled it compares the reference signal to the PLL feedback signal and in response thereto outputs a comparison signal,
- a filter connected to an output of the phase detector, and
- a switching device connected to an output of the filter, wherein outputs of the parallel branches are connected together to provide a signal for producing the tuning voltage for the VCO.

22. The PLL of claim 21, wherein each branch further comprises a charge pump connected between the phase/frequency detector and the filter.

23. The PLL of claim 21, wherein the means for selectively enabling and disabling the phase detector comprises means for selectively connecting and disconnecting at least one of a supply voltage and a supply current to the phase detector to selectively activate and deactivate the phase detector.

* * * * *